(12) United States Patent
Shinagawa et al.

(10) Patent No.: US 9,961,780 B2
(45) Date of Patent: May 1, 2018

(54) METHOD FOR MANUFACTURING RESIN MULTILAYER BOARD

(71) Applicant: Murata Manufacturing Co., Ltd., Kyoto (JP)

(72) Inventors: Hirofumi Shinagawa, Kyoto (JP); Shigeru Tago, Kyoto (JP); Masaki Kawata, Kyoto (JP); Yuki Ito, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 188 days.

(21) Appl. No.: 14/926,316

(22) Filed: Oct. 29, 2015

(65) Prior Publication Data

US 2016/0050766 A1 Feb. 18, 2016

Related U.S. Application Data

(63) Continuation of application No. PCT/JP2014/064667, filed on Jun. 3, 2014.

(30) Foreign Application Priority Data

Jun. 18, 2013 (JP) .................................. 2013-127447
Jul. 10, 2013 (JP) .................................. 2013-144146
Jan. 14, 2014 (JP) .................................. 2014-004357

(51) Int. Cl.
*H05K 3/32* (2006.01)
*H05K 1/18* (2006.01)
(Continued)

(52) U.S. Cl.
CPC ............... *H05K 3/32* (2013.01); *H05K 1/185* (2013.01); *H05K 3/0073* (2013.01); *H05K 3/306* (2013.01);
(Continued)

(58) Field of Classification Search
CPC .......... H05K 3/00; H05K 3/10; H05K 3/0073; H05K 3/306; H05K 3/323; H05K 3/4611;
(Continued)

(56) References Cited

U.S. PATENT DOCUMENTS 5,497,033 A 3/1996 Fillion et al.
6,271,469 B1 8/2001 Ma et al.
(Continued)

FOREIGN PATENT DOCUMENTS

CN 1406385 A 3/2003
JP H07-007134 A 1/1995
(Continued)

OTHER PUBLICATIONS

International Search Report issued in Application No. PCT/JP2014/064667 dated Aug. 12, 2014.
(Continued)

*Primary Examiner* — Carl Arbes
(74) *Attorney, Agent, or Firm* — Pearne and Gordon LLP (57) ABSTRACT

A method for manufacturing a resin multilayer board formed from a thermoplastic resin, which method allows for improvement in accuracy of the position of a component relative to the resin multilayer board, is provided. A method for manufacturing a resin multilayer board includes: a step of bonding a component to a pressure-sensitive adhesive layer of a pressure-sensitive adhesive sheet having the pressure-sensitive adhesive layer on a surface thereof; a step of opposing a thermoplastic resin sheet to the pressure-sensitive adhesive layer, and fixing the component bonded to the pressure-sensitive adhesive sheet and the thermoplastic resin sheet to each other by heating; a step of peeling the pressure-sensitive adhesive sheet from the component fixed to the thermoplastic resin sheet; and stacking and thermally welding a plurality of thermoplastic resin sheets including
(Continued)

the thermoplastic resin sheet to which the component has been transferred.

16 Claims, 4 Drawing Sheets

(51) Int. Cl.
*H05K 3/46* (2006.01)
*H05K 3/30* (2006.01)
*H05K 3/00* (2006.01)

(52) U.S. Cl.
CPC ......... *H05K 3/4611* (2013.01); *H05K 3/4644* (2013.01); *H05K 3/4697* (2013.01); *H05K 1/186* (2013.01); *H05K 3/4632* (2013.01); *H05K 2201/0129* (2013.01); *H05K 2203/061* (2013.01); *H05K 2203/063* (2013.01)

(58) Field of Classification Search
CPC .. H05K 3/4632; H05K 3/4644; H05K 3/4697; H05K 2203/061; H05K 2203/063; H01K 1/185; H01K 1/186
See application file for complete search history.

(56) References Cited

U.S. PATENT DOCUMENTS

| | | | |
|---|---|---|---|
| 6,808,642 B2* | 10/2004 | Takaya | H01F 17/0006 216/13 |
| 6,969,436 B2* | 11/2005 | Curcio | B32B 3/266 156/48 |
| 6,995,322 B2* | 2/2006 | Chan | H01L 23/5383 174/260 |
| 2003/0029830 A1 | 2/2003 | Takaya et al. | |
| 2006/0202318 A1* | 9/2006 | Satou | H01L 27/14618 257/686 |
| 2007/0182000 A1 | 8/2007 | Higashitani et al. | |
| 2007/0221404 A1* | 9/2007 | Das | H05K 1/0313 174/264 |
| 2008/0295326 A1 | 12/2008 | Tuominen et al. | |
| 2009/0241332 A1* | 10/2009 | Lauffer | H05K 3/462 29/829 |

FOREIGN PATENT DOCUMENTS

| | | |
|---|---|---|
| JP | 2000-223837 A | 8/2000 |
| JP | 2001-332866 A | 11/2001 |
| JP | 2003-243797 A | 8/2003 |
| JP | 2004-158545 A | 6/2004 |
| JP | 2005-223183 A | 8/2005 |
| JP | 2008-509549 A | 3/2008 |
| JP | 2011-061052 A | 3/2011 |

OTHER PUBLICATIONS

Written Opinion issued in Application No. PCT/JP2014/064667 dated Aug. 12, 2014.

* cited by examiner

METHOD FOR MANUFACTURING RESIN MULTILAYER BOARD

BACKGROUND

1. Technical Field

The present disclosure relates to a method for manufacturing a resin multilayer board which is formed from a thermoplastic resin and has a component incorporated therein or mounted thereon.

2. Description of the Related Art

As a resin multilayer board, a resin multilayer board having flexibility is used in some cases. Such a resin multilayer board is formed, for example, by thermally welding a plurality of thermoplastic resin sheets to each other in a state where the thermoplastic resin sheets are stacked (see, for example, Japanese Unexamined Patent Application Publication No. 2004-158545).

Japanese Unexamined Patent Application Publication No. 2004-158545 discloses a method for manufacturing a resin multilayer board having a semiconductor element (component) incorporated therein, by thermally welding a plurality of thermoplastic resin sheets to each other while pressing the plurality of thermoplastic resin sheets in a state where the semiconductor element (component) is disposed at a desired position in the plurality of thermoplastic resin sheets stacked with each other.

However, in the manufacturing method disclosed in Japanese Unexamined Patent Application Publication No. 2004-158545, in transferring the thermoplastic resin sheet in a state where the component is put thereon or in thermally welding the plurality of thermoplastic resin sheets while pressing the plurality of thermoplastic resin sheets, the component may be displaced relative to the thermoplastic resin sheet. In such a case, the component is incorporated in the resin multilayer board in a state where the component is displaced from a desired position.

SUMMARY

Accordingly, the present disclosure provides a method for manufacturing a resin multilayer board formed from a thermoplastic resin, which method allows for improvement in accuracy of the position of a component incorporated in or mounted on the resin multilayer board.

A method for manufacturing a resin multilayer board according to the present disclosure includes the steps of: bonding a component to a pressure-sensitive adhesive layer of a pressure-sensitive adhesive sheet having the pressure-sensitive adhesive layer on a surface thereof; opposing a thermoplastic resin base material to the pressure-sensitive adhesive layer side of the pressure-sensitive adhesive sheet, and joining the component bonded to the pressure-sensitive adhesive sheet and the thermoplastic resin base material to each other by heating; peeling the pressure-sensitive adhesive sheet from the component joined to the thermoplastic resin base material; and stacking and thermally welding a plurality of thermoplastic resin base materials including the thermoplastic resin base material to which the component has been joined and from which the pressure-sensitive adhesive sheet has been peeled.

In the manufacturing method, by bonding the component to the pressure-sensitive adhesive sheet, it is possible to position the component relative to the pressure-sensitive adhesive sheet with high accuracy. By transferring the component positioned relative to the pressure-sensitive adhesive sheet with high accuracy from the pressure-sensitive adhesive sheet to the thermoplastic resin base material, it is possible to stack and dispose the pressure-sensitive adhesive sheet on the thermoplastic resin base material in a state where the component is fixed to the pressure-sensitive adhesive sheet. Thus, even in a state where heating has not been performed and the pressure-sensitive adhesive sheet and the thermoplastic resin base material are not joined, it is possible to accurately dispose the component at a desired position while displacing of the component is reduced. Therefore, since it is possible to stack and thermally weld a plurality of thermoplastic resin base materials in a state where the component is accurately positioned relative to the thermoplastic resin base material, it is possible to reduce displacement of the component in thermal welding. As a result, it is possible to accurately incorporate or mount the component at a desired position in the resin multilayer board. Accordingly, for example, even in the case where a conductor portion (a terminal electrode, etc.) of the component is electrically connected to a conductor portion at the thermoplastic resin base material side, it is possible to assuredly bring the conductor portion of the component and the conductor portion at the thermoplastic resin base material side into contact with each other. Thus, it is possible to assuredly establish electric continuity between the conductor portion of the component and the conductor portion at the thermoplastic resin base material side.

In the above-described method for manufacturing the resin multilayer board, when the component includes a conductor portion on a surface joined to the thermoplastic resin base material, the thermoplastic resin base material includes a via portion in which a conductive paste which is metallized with heating is provided at the surface joined to the conductor portion and in the step of joining the component and the thermoplastic resin base material to each other by heating, the conductor portion of the component and the conductive paste of the via portion can be joined to each other. In particular, the conductor portion and the conductive paste form an intermetallic compound by heating to a predetermined temperature lower than a temperature (e.g., 250° C.) at which the thermoplastic resin base material is plasticized. For example, the conductive paste may contain Sn, and the conductor portion may contain Cu.

In the manufacturing method, by metalizing the conductive paste in the via portion, it is possible to join the conductor portion of the component and the via portion of the thermoplastic resin base material to each other, so that it is possible to increase the joining strength between the component and the thermoplastic resin base material. Thus, it is possible to assuredly prevent the component from being displaced, and it is also possible to easily peel the pressure-sensitive adhesive sheet from the component. Moreover, in the case where the intermetallic compound is formed between the conductor portion and the via portion by heating to the predetermined temperature lower than the temperature at which the thermoplastic resin base material is plasticized, it is possible to join the conductor portion and the via portion to each other via the intermetallic compound in transferring the component from the pressure-sensitive adhesive sheet to the thermoplastic resin base material. Thus, it is possible to enhance the electric continuity between the conductor portion and the via portion, and it is possible to assuredly prevent the component from being displaced relative to the thermoplastic resin base material, so that it is possible to further increase the accuracy of the position of the component in the resin multilayer board.

BRIEF DESCRIPTION OF THE DRAWINGS

FIGS. 3A to 3H are side cross-sectional views at respective stages of a procedure of manufacturing a resin multilayer board according to a second embodiment of the present disclosure.

DETAILED DESCRIPTION

Hereinafter, methods for manufacturing a resin multilayer board according to embodiments of the present disclosure will be described.

In the following description, a main part of one resin multilayer board is illustrated in each drawing, and a method for manufacturing the resin multilayer board will be described. However, a plurality of resin multilayer boards can be manufactured at one time from a wide board from which a plurality of resin multilayer boards can be cut out.

In addition, in the following description, methods for manufacturing a resin multilayer board will be described with, as an example, the case where a thermoplastic resin sheet in a single layer state being used as a thermoplastic resin base material to be used in each step. However, as the thermoplastic resin base material, a plate-like or block-like one in which a plurality of thermoplastic resin sheets are joined beforehand may be used.

First, a method for manufacturing a resin multilayer board 10 according to a first embodiment of the present disclosure will be described.

Figure 1:
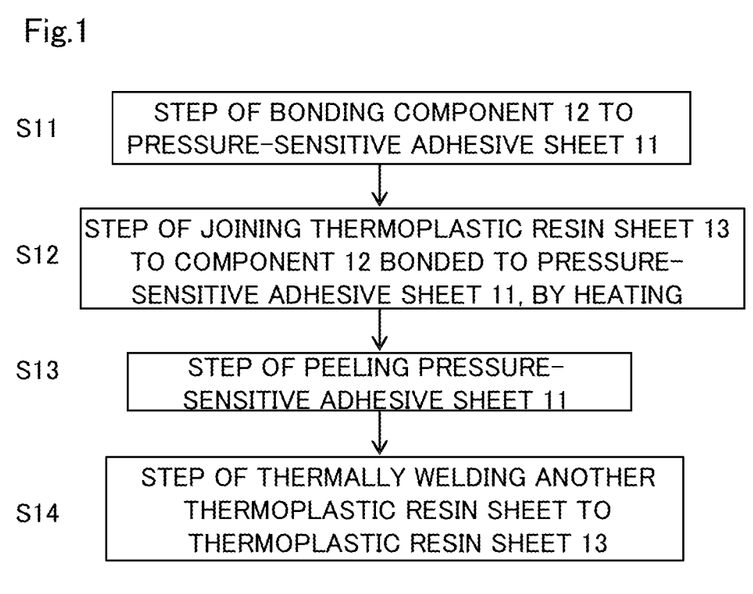
FIG. 1 is a diagram showing a flowchart of a method for manufacturing a resin multilayer board according to a first embodiment of the present disclosure.

FIG. 1 is a diagram showing a flowchart of the method for manufacturing the resin multilayer board 10. FIGS. 2A to 2G are side cross-sectional views showing states in a procedure of manufacturing the resin multilayer board 10. The resin multilayer board 10 manufactured in this embodiment has a component 12 incorporated in a resin multilayer body 15 as shown in FIG. 2G.

As shown in FIG. 1, in the method for manufacturing the resin multilayer board 10, first, step S11 of preparing a pressure-sensitive adhesive sheet 11 having a pressure-sensitive adhesive layer on a surface thereof, and bonding (temporarily fixing) the component 12 to the pressure-sensitive adhesive layer of the pressure-sensitive adhesive sheet 11, is executed. Next, step S12 of opposing a thermoplastic resin sheet 13 to the pressure-sensitive adhesive layer side of the pressure-sensitive adhesive sheet 11, and joining (temporarily joining) the thermoplastic resin sheet 13 to the component 12 bonded to the pressure-sensitive adhesive sheet 11 by heating, is executed. Then, step S13 of peeling the pressure-sensitive adhesive sheet 11 from the component 12 joined to the thermoplastic resin sheet 13, to transfer the component 12 to the thermoplastic resin sheet 13, is executed. Next, step S14 of thermally welding (finally joining) another thermoplastic resin sheet to the thermoplastic resin sheet 13 to which the component 12 has been joined, to form the resin multilayer body 15, is executed. Thus, it is possible to manufacture the resin multilayer board 10 with increased accuracy of the position of the incorporated component 12 relative to the resin multilayer body 15.

Figure 2A:
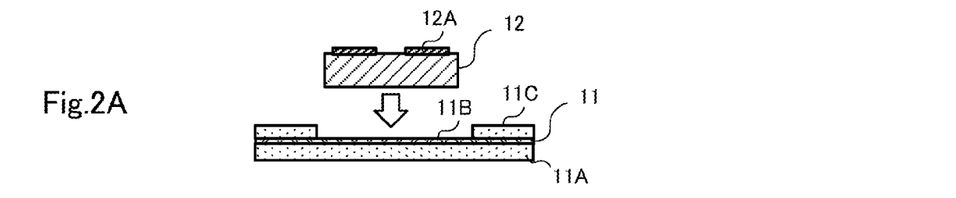
FIGS. 2A to 2G are side cross-sectional views at respective stages of a procedure of manufacturing the resin multilayer board according to the first embodiment of the present disclosure.

FIG. 2A is a side cross-sectional view in manufacturing step S11 for the resin multilayer board 10. In step S11, first, the pressure-sensitive adhesive sheet 11 is prepared. The pressure-sensitive adhesive sheet 11 includes a resin layer 11A, a pressure-sensitive adhesive layer 11B, and a mask layer 11C. The pressure-sensitive adhesive layer 11B is provided on one principal surface of the resin layer 11A. The mask layer 11C is bonded to the resin layer 11A via the pressure-sensitive adhesive layer 11B, and covers most of a remaining region of the pressure-sensitive adhesive layer 11B except for a region of the pressure-sensitive adhesive layer 11B to which the component 12 is bonded. Since the pressure-sensitive adhesive layer 11B is covered with the mask layer 11C, it is possible to prevent the pressure-sensitive adhesive sheet 11 from being bonded directly to the thermoplastic resin sheet 13 in joining the component 12 to the thermoplastic resin sheet 13 described later. The mask layer 11C may not necessarily be provided.

The resin layer 11A of the pressure-sensitive adhesive sheet 11 is a sheet which contains, for example, PET (polyethylene terephthalate) or the like as a principal material and has flexibility. The resin layer 11A may contain PEN (polyethylene naphthalate), polyester, PPS (polyphenylene sulfide), or the like other than PET as a principal material. The pressure-sensitive adhesive layer 11B is composed of an adhesive having such a weak adhesive force as to allow the component 12 to be peeled off later, such as an acrylic adhesive. For the pressure-sensitive adhesive layer 11B, a silicone adhesive or the like other than an acrylic adhesive may be used. The mask layer 11C is a sheet which contains, for example, PET (polyethylene terephthalate) or the like as a principal material and has flexibility. The mask layer 11C may contain PEN (polyethylene naphthalate), polyester, PPS (polyphenylene sulfide), or the like other than PET as a principal material.

Together with the aforementioned pressure-sensitive adhesive sheet 11, the component 12 is prepared. Here, the component 12 is an IC component and has conductor portions (terminal electrodes) 12A on one principal surface thereof. The component 12 may be another electronic component such as a passive element, or a non-electronic component such as a heat sink.

Figure 2B:
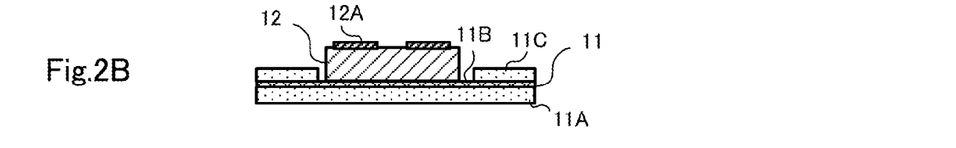

The surface of the component 12 that is opposite to the surface of the component 12 on which the conductor portions (terminal electrodes) 12A are provided is opposed to the pressure-sensitive adhesive layer 11B exposed from the mask layer 11C of the pressure-sensitive adhesive sheet 11, and the component 12 is bonded to the pressure-sensitive adhesive sheet 11 in a state where the component 12 is positioned with high accuracy. A structure shown in FIG. 2B is realized by step S11.

In the case where a substantially transparent one is used as the pressure-sensitive adhesive sheet 11, a marking indicating a component-disposed position is provided at the resin layer 11A side of the pressure-sensitive adhesive sheet 11 beforehand, and the component 12 is disposed on the marking from the pressure-sensitive adhesive layer 11B side by using an automatic mounting apparatus or the like, whereby it is possible to bond the component 12 to the pressure-sensitive adhesive sheet 11 with high position accuracy. Alternatively, the component 12 may be bonded to the pressure-sensitive adhesive sheet 11 with high position accuracy by fixing the component 12 on a component tray with high position accuracy beforehand and pressing the pressure-sensitive adhesive sheet 11 thereon.

In the case where a plurality of types of components 12 are provided to the resin multilayer board 10, the plurality of types of components 12 may be bonded to the same pressure-sensitive adhesive sheet 11, or each of the types of components 12 may be bonded to a different pressure-sensitive adhesive sheet 11, and then the plurality of types of components 12 may be transferred to a single thermoplastic resin sheet 13 from a plurality of the pressure-sensitive adhesive sheets 11 in order.

Figure 2C:
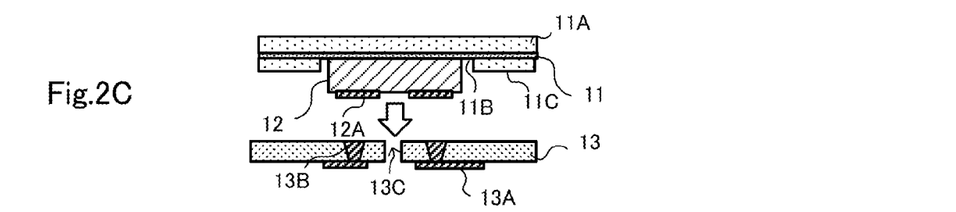

FIG. 2C is a side cross-sectional view in manufacturing step S12 for the resin multilayer board 10. In step S12, first, the thermoplastic resin sheet 13 is prepared. The thermoplastic resin sheet 13 includes conductor portions 13A, via portions 13B, and a through hole 13C.

The thermoplastic resin sheet 13 is a sheet which contains, for example, a liquid crystal polymer or the like as a principal material. As the principal material of the thermoplastic resin sheet 13, a thermoplastic resin such as PEEK (polyether ether ketone), PEI (polyether imide), PPS (polyphenylene sulfide), or PI (polyimide) may also be used. The conductor portions 13A are pattern-formed by etching a conductor foil such as a copper foil provided on one surface of the thermoplastic resin sheet 13. The via portions 13B are each formed by forming a via hole in the thermoplastic resin sheet 13 by means of a carbon dioxide laser or the like such that the via hole penetrates the thermoplastic resin sheet 13 without necessarily penetrating any conductor portion 13A; and filling the via hole with a conductive paste, in an uncured state, which is composed of a metallic material, an organic solvent, and the like. The through hole 13C is for removing gas, which is generated when the conductive paste is metallized or when thermoplastic resin sheets are stacked and thermally welded to each other, from between the component 12 and the thermoplastic resin sheet 13, and is provided at a position on the thermoplastic resin sheet 13 at which the component 12 is disposed. The through hole 13C may not necessarily be provided.

Next, the surface of the pressure-sensitive adhesive sheet 11 at the pressure-sensitive adhesive layer 11B and mask layer 11C side is opposed to the surface of the thermoplastic resin sheet 13 at the side at which the via portions 13B are exposed. At that time, holes (not shown) into which pins (not shown) for positioning are to be inserted may be formed beforehand in the thermoplastic resin sheet 13 and the pressure-sensitive adhesive sheet 11. Thus, the thermoplastic resin sheet 13 and the pressure-sensitive adhesive sheet 11 can be positioned with high accuracy by inserting the pins into the holes.

Figure 2D:
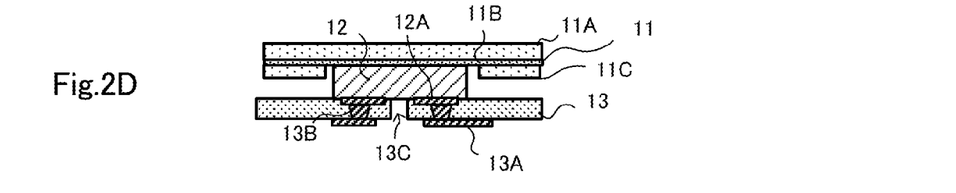

Then, the surface of the thermoplastic resin sheet 13 is pressed against the surface of the component 12 bonded to the pressure-sensitive adhesive sheet 11, and the surface of the component 12 and the surface of the thermoplastic resin sheet 13 are joined directly to each other by heating. That is, in a state where the thermoplastic resin sheet 13 that has not been heated (in a room-temperature state) is not softened, the thermoplastic resin sheet 13 and the pressure-sensitive adhesive sheet 11 are stacked with each other and the component 12 is pressed against a desired position on the surface of the thermoplastic resin sheet 13. By heating in this state, the thermoplastic resin sheet 13 is softened to join the thermoplastic resin sheet 13 and the component 12 to each other. Since it is possible to press the component 12 in the state where the thermoplastic resin sheet 13 that has not been heated is not softened as described above, it is possible to accurately position the component 12 relative to the thermoplastic resin sheet 13. A structure shown in FIG. 2D is realized by step S12.

At that time, the via portions 13B of the thermoplastic resin sheet 13 are brought into contact with the conductor portions 12A of the component 12 bonded to the pressure-sensitive adhesive sheet 11, and the conductive paste loaded in the via portions 13B is metallized by heating, thereby directly joining the via portions 13B and the conductor portions 12A to each other. If, for example, Cu is used as the metallic material of the surface of each conductor portion 12A and, for example, Sn is used as the metallic material contained in the conductive paste of each via portion 13B, it is possible to form an intermetallic compound (e.g., $Cu_6Sn_5$) from the metallic material of the surface of each conductor portion 12A and the metallic material contained in the conductive paste of each via portion 13B, through heating at a predetermined temperature lower than a temperature condition under which the thermoplastic resin sheet 13 is plasticized by heating. Thus, the conductor portions 12A and the via portions 13B are joined to each other, whereby it is possible to firmly join the component 12 and the thermoplastic resin sheet 13 to each other and assuredly establish electric continuity between the conductor portions 12A and the via portions 13B. The combination of the metallic material of the surface of the conductor portions 12A and the metallic material contained in the conductive paste of the via portions 13B may be a combination other than the above, and it can be a combination of metallic materials from which it is possible to form an intermetallic compound to join the conductor portions 12A and the via portions 13B to each other.

By causing the surface of the thermoplastic resin sheet 13 and the surface of the component 12 to directly contact and be joined to each other; and joining the conductor portions 12A and the via portions 13B to each other by means of the intermetallic compound as described above, it is possible to more firmly join the thermoplastic resin sheet 13 and the component 12 to each other. Thus, it is possible to increase the accuracy of the position of the component 12 relative to the thermoplastic resin sheet 13. By directly joining the conductor portions 12A and the via portions 13B to each other by means of the intermetallic compound, it is possible to firmly join the component 12 and the thermoplastic resin sheet 13 to each other even with a combination of materials of the component 12 and the thermoplastic resin sheet 13 with which it is difficult to increase the joining strength between the surfaces of the component 12 and the thermoplastic resin sheet 13.

Step S12 may be accomplished by placing the component 12 bonded to the pressure-sensitive adhesive sheet 11, on the thermoplastic resin sheet 13 that has not been heated, and then pressing the component 12 against the thermoplastic resin sheet 13 while heating the thermoplastic resin sheet 13 to soften the thermoplastic resin sheet 13.

By such step S12, it is possible to join the thermoplastic resin sheet 13 to the component 12 that has been positioned with high accuracy relative to the pressure-sensitive adhesive sheet 11, thereby increasing the accuracy of the position of the component 12 relative to the thermoplastic resin sheet 13.

Figure 2E:
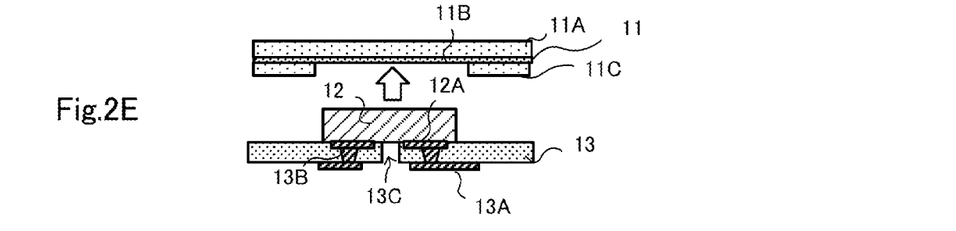

FIG. 2E is a side cross-sectional view in manufacturing step S13 for the resin multilayer board 10. In step S13, after the temperature falls to a temperature at which the thermoplastic resin sheet 13 and the via portions 13B are sufficiently cured, the pressure-sensitive adhesive sheet 11 is peeled from the component 12 joined to the thermoplastic resin sheet 13. Thus, it is possible to transfer the component 12 from the pressure-sensitive adhesive sheet 11 to the thermoplastic resin sheet 13. At that time, the conductive paste loaded in each via portion 13B and each conductor portion 12A of the component 12 form an intermetallic compound to join the via portion 13B and the conductor portion 12A to each other. Thus, it is possible to assuredly prevent the component 12 from being displaced relative to the thermoplastic resin sheet 13, and it is also possible to easily peel only the pressure-sensitive adhesive sheet 11 from the component 12 without necessarily peeling the component 12 from the thermoplastic resin sheet 13. In addition, electric continuity between the conductor portions 12A of the component 12 and the via portions 13B is enhanced.

Figure 2F:
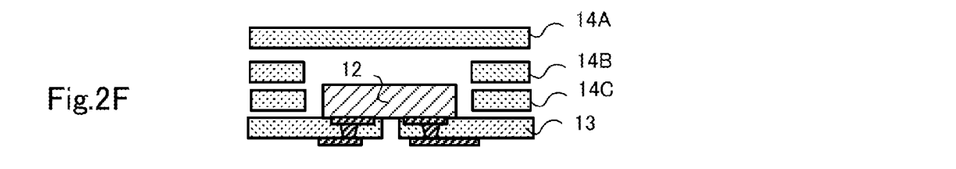
Figure 2G:
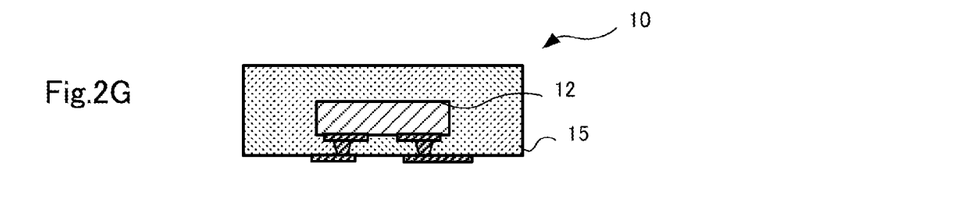

FIG. 2F is a side cross-sectional view in manufacturing step S14 for the resin multilayer board 10. In step S14, thermoplastic resin sheets 14A, 14B, and 14C each having the same shape as the thermoplastic resin sheet 13 are prepared. Some of the thermoplastic resin sheets 14A, 14B, and 14C are provided with an opening for providing the component 12.

The thermoplastic resin sheets 14C, 14B, and 14A are stacked in this order on the surface of the thermoplastic resin sheet 13, to which the component 12 has been transferred, at the side at which the component 12 is disposed. Then, the multilayer body of the respective thermoplastic resin sheets is pressed from both upper and lower sides with a press die of a hot-press machine while the thermoplastic resin sheets 13, 14C, 14B, and 14A are heated to a higher temperature than a temperature condition under which the thermoplastic resin sheets 13, 14C, 14B, and 14A are plasticized. Thus, it is possible to thermally weld the thermoplastic resin sheets 14C, 14B, and 14A to the thermoplastic resin sheet 13 in a state where the electric continuity between the via portions 13B and the conductor portions 12A is ensured and in a state where the thermoplastic resin sheet 13 and the component 12 are firmly joined to each other, thereby forming the resin multilayer body 15 shown in FIG. 2G.

At that time, the thermoplastic resin which forms the thermoplastic resin sheets 13, 14C, 14B, and 14A flows, so that it is possible to fill the through hole 13C provided in the thermoplastic resin sheet 13 and the gap between the resin multilayer body 15 and the component 12, with the thermoplastic resin.

Through the respective steps S11 to S14 described above, the resin multilayer board 10 according to the present embodiment is manufactured. In the resin multilayer board 10, the component 12 which is positioned with high accuracy and bonded to the pressure-sensitive adhesive sheet 11 is transferred from the pressure-sensitive adhesive sheet 11 to the thermoplastic resin sheet 13, and then a plurality of thermoplastic resin sheets including the thermoplastic resin sheet 13 are thermally welded to each other. Therefore, even when shock or vibration is added to the thermoplastic resin sheet 13 or the resin flows in thermal welding, the component 12 is not substantially displaced, and the component 12 is incorporated in the resin multilayer board 10 with high position accuracy relative to the resin multilayer body 15. Thus, the method for manufacturing the resin multilayer board 10 according to the first embodiment is particularly effective when the component 12 which is a component such as an IC component having a large number of minute terminals is incorporated.

In the description of the present embodiment, the component 12 having the conductor portions (terminal electrodes) 12A is used, but the entirety of the component 12 may be composed of a conductor. In this case as well, it is possible to directly join the via portions 13B of the thermoplastic resin sheet 13 to the component 12 whose entirety is composed of a conductor. Even by so doing, it is possible to firmly join the component 12 and the thermoplastic resin sheet 13 to each other. In addition, a Cu foil may be formed on the lower surface or the like of the thermoplastic resin sheet 14A in FIG. 2F. In such a case as well, when the Cu foil is beforehand removed partially at a portion which is in contact with the incorporated component 12, of the lower surface of the thermoplastic resin sheet 14A, it is possible to enhance the joinability between the incorporated component 12 and the thermoplastic resin sheet 14A.

Next, a method for manufacturing a resin multilayer board 20 according to a second embodiment of the present disclosure will be described. Here, a method for manufacturing a resin multilayer board (RF module) 20 having an RFIC component mounted on a surface thereof will be described as an example.

FIGS. 3A to 3H are side cross-sectional views showing a procedure of manufacturing the resin multilayer board 20 according to the present embodiment. A flowchart according to the method for manufacturing the resin multilayer board 20 is the same as the flowchart according to FIG. 1 shown in the first embodiment.

Figures 3A, 3B:
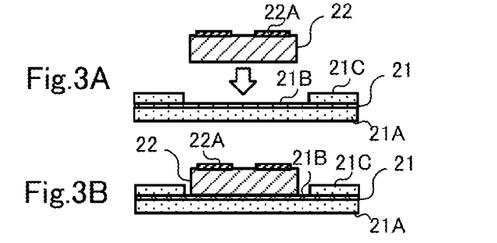

In the method for manufacturing the resin multilayer board 20, first, a step shown in FIG. 3A is executed. The step shown in FIG. 3A is a step corresponding to step S11 shown in FIG. 1.

In step S11, first, a pressure-sensitive adhesive sheet 21 and a component 22 are prepared. The pressure-sensitive adhesive sheet 21 includes a resin layer 21A, a pressure-sensitive adhesive layer 21B, and a mask layer 21C. The pressure-sensitive adhesive layer 21B is provided on one principal surface of the resin layer 21A. The mask layer 21C is bonded to the resin layer 21A via the pressure-sensitive adhesive layer 21B, to cover most of a remaining region of the pressure-sensitive adhesive layer 21B except for a region of the pressure-sensitive adhesive layer 21B to which the component 22 is bonded. Here, the component 22 is an RFIC component, and has conductor portions (terminal electrodes) 22A on a surface opposite to a surface joined to the pressure-sensitive adhesive sheet 21.

The surface of the component 22 that is opposite to the surface of the component 22 on which the conductor portions (terminal electrodes) 22A are provided is opposed to the pressure-sensitive adhesive layer 21B exposed from the mask layer 21C of the pressure-sensitive adhesive sheet 21, and the component 22 is bonded to the pressure-sensitive adhesive sheet 21 in a state where the component 22 is positioned with high accuracy. A structure shown in FIG. 3B is realized by this step.

Figure 3C:
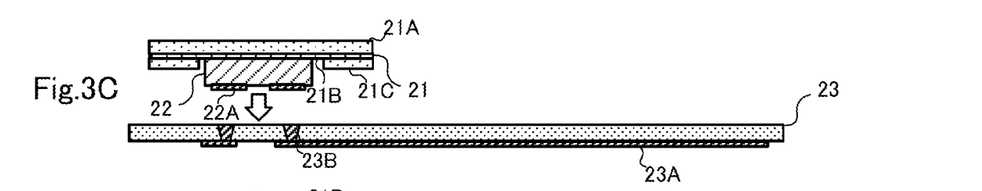

Next, in the method for manufacturing the resin multilayer board 20, a step shown in FIG. 3C is executed. The step shown in FIG. 3C is a step corresponding to step S12 shown in FIG. 1.

In step S12, first, a thermoplastic resin sheet 23 is prepared. The thermoplastic resin sheet 23 has a long shape, has, at one end in the longitudinal direction, a space for mounting an RFIC component and a patch antenna component, and has, at the other end in the longitudinal direction, a space for mounting a connector component. In addition, the thermoplastic resin sheet 23 includes, at the one end in the longitudinal direction, via portions 23B provided at the mounting surface side at which the component 22 corresponding to the RFIC component is mounted, and includes, on a surface opposite to the mounting surface for the component 22, a conductor portion 23A extending from the one end to the other end in the longitudinal direction. The via portions 23B are formed by filling via holes of the thermoplastic resin sheet 23 with a conductive paste in an uncured state.

Next, the surface of the pressure-sensitive adhesive sheet 21 at the pressure-sensitive adhesive layer 21B and mask layer 21C side is opposed to the surface of the thermoplastic resin sheet 23 at the side at which the via portions 23B are exposed. At that time, holes (not shown) into which pins (not shown) for positioning are to be inserted may be formed beforehand in the thermoplastic resin sheet 23 and the pressure-sensitive adhesive sheet 21. Thus, the thermoplastic resin sheet 23 and the pressure-sensitive adhesive sheet 21 can be positioned with high accuracy by inserting the pins into the holes.

Figure 3D:
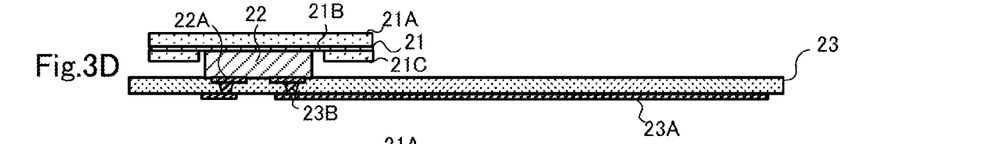

Then, the surface of the thermoplastic resin sheet 23 is pressed against the surface of the component 22 bonded to the pressure-sensitive adhesive sheet 21, and the surface of the component 22 and the surface of the thermoplastic resin sheet 23 are joined directly to each other by heating. That is, in a state where the thermoplastic resin sheet 23 that has not been heated (in a room-temperature state) is not softened, the thermoplastic resin sheet 23 and the pressure-sensitive adhesive sheet 21 are stacked with each other, and the component 22 is pressed against a desired position on the surface of the thermoplastic resin sheet 23. By heating in this state, the thermoplastic resin sheet 23 is softened to join the thermoplastic resin sheet 23 and the component 22 to each other. Since it is possible to press the component 22 in the state where the thermoplastic resin sheet 23 that has not been heated is not softened as described above, it is possible to accurately position the component 22 relative to the thermoplastic resin sheet 23. A structure shown in FIG. 3D is realized by step S12.

At that time, the via portions 23B of the thermoplastic resin sheet 23 are brought into contact with the conductor portions 22A of the component 22 bonded to the pressure-sensitive adhesive sheet 21, and the conductive paste loaded in the via portions 23B is metallized by heating, thereby directly joining the via portions 23B and the conductor portions 22A to each other. If, for example, Cu is used as the metallic material of the surface of each conductor portion 22A and, for example, Sn is used as the metallic material contained in the conductive paste of each via portion 23B, it is possible to form an intermetallic compound (e.g., $Cu_6Sn_5$) from the metallic material of the surface of each conductor portion 22A and the metallic material contained in the conductive paste of each via portion 23B, through heating at a predetermined temperature lower than a temperature condition under which the thermoplastic resin sheet 23 is plasticized by heating. Thus, the conductor portions 22A and the via portions 23B are joined to each other, whereby it is possible to firmly join the component 22 and the thermoplastic resin sheet 23 to each other. The combination of the metallic material of the surface of the conductor portions 22A and the metallic material contained in the conductive paste of the via portions 23B may be a combination other than the above, and it can be a combination of metallic materials from which it is possible to form an intermetallic compound to join the conductor portions 22A and the via portions 23B to each other.

By causing the surface of the thermoplastic resin sheet 23 and the surface of the component 22 to directly contact and be joined to each other; and joining the conductor portions 22A and the via portions 23B to each other by means of the intermetallic compound as described above, it is possible to more firmly join the thermoplastic resin sheet 23 and the component 22 to each other. Thus, it is possible to increase the accuracy of the position of the component 22 relative to the thermoplastic resin sheet 23.

Figure 3E:
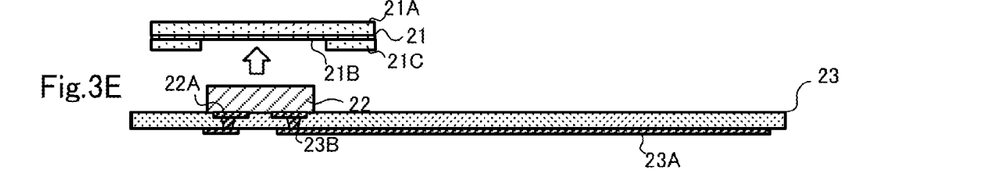

Next, in the method for manufacturing the resin multilayer board 20, a step shown in FIG. 3E is executed. The step shown in FIG. 3E is a step corresponding to step S13 shown in FIG. 1.

In step S13, after the temperature falls to a temperature at which the thermoplastic resin sheet 23 and the via portions 23B are sufficiently cured, the pressure-sensitive adhesive sheet 21 is peeled from the component 22 joined to the thermoplastic resin sheet 23. Thus, it is possible to transfer the component 22 from the pressure-sensitive adhesive sheet 21 to the thermoplastic resin sheet 23. At that time, the conductive paste loaded in each via portion 23B and each conductor portion 22A of the component 22 form an intermetallic compound to join the via portion 23B and the conductor portion 22A to each other. Thus, it is possible to assuredly prevent the component 22 from being displaced relative to the thermoplastic resin sheet 23, and it is also possible to easily peel only the pressure-sensitive adhesive sheet 21 from the component 22 without necessarily peeling the component 22 from the thermoplastic resin sheet 23. In addition, electric continuity between the conductor portions 22A of the component 22 and the via portions 23B is enhanced.

Figure 3F:
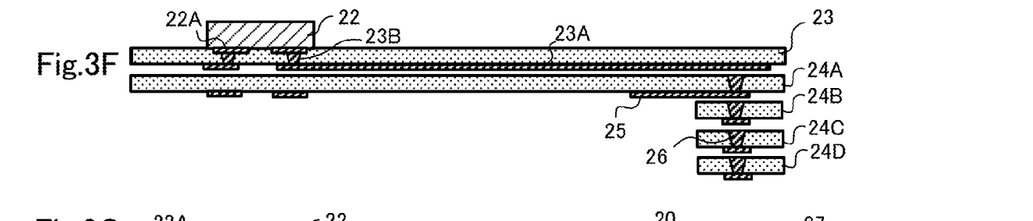
Figure 3G:
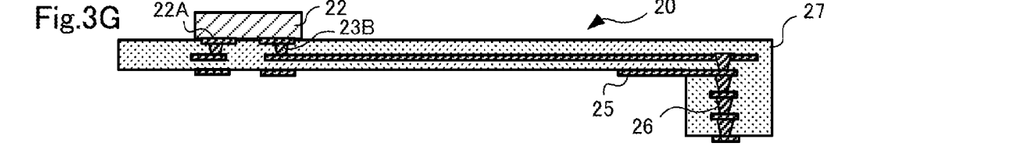

FIG. 3F is a side cross-sectional view in manufacturing step S14 for the resin multilayer board 20. In step S14, each of thermoplastic resin sheets 24A, 24B, 24C, and 24D each having a conductor portion 25 having a predetermined pattern and a via portion 26 filled with a conductive paste is formed in a predetermined pattern. Then, the thermoplastic resin sheets 24A, 24B, 24C, and 24D are stacked in this order on the surface of the thermoplastic resin sheet 23, to which the component 22 has been transferred, at the side opposite to the surface on which the component 22 is disposed. Then, the multilayer body of the respective thermoplastic resin sheets is pressed from both upper and lower sides with a press die of a hot-press machine while the thermoplastic resin sheets 23, 24A, 24B, 24C, and 24D are heated to a higher temperature than a temperature condition under which the thermoplastic resin sheets 23, 24A, 24B, 24C, and 24D are plasticized. Thus, the thermoplastic resin sheets 23, 24A, 24B, 24C, and 24D are thermally welded and integrated with each other in a state where the electric continuity between the via portions 23B and the conductor portions 22A is ensured and in a state where the thermoplastic resin sheet 23 and the component 22 are firmly joined to each other, thereby forming a resin multilayer body 27. In addition, at that time, the conductive paste provided in the via portions 26 of the thermoplastic resin sheets 24A, 24B, 24C, and 24D is metallized to make inter-layer connection between the conductor portions 23A and 25 adjacent to the respective via portions 26. The structure of the resin multilayer board 20 shown in FIG. 3G is realized by this step.

Next, in the method for manufacturing the resin multilayer board 20, a step shown in FIG. 3H is executed. In the step shown in FIG. 3H, a component 28 such as a patch antenna component or a connector component is mounted on a surface of a portion of the conductor portion 25 exposed on the surface of the resin multilayer board 20.

Through the respective steps S11 to S14 described above, the resin multilayer board 20 according to the present embodiment is manufactured. In the resin multilayer board 20, the component 22 which is positioned with high accuracy and bonded to the pressure-sensitive adhesive sheet 21 is transferred from the pressure-sensitive adhesive sheet 21 to the thermoplastic resin sheet 23, and then a plurality of thermoplastic resin sheets including the thermoplastic resin sheet 23 are thermally welded to each other to form the resin multilayer body 27. Therefore, even when shock or vibration is added to the thermoplastic resin sheet 23 or the resin flows in thermal welding, the component 22 is unlikely to be displaced, and is incorporated in the resin multilayer board 20 with high position accuracy relative to the resin multilayer body 27. Thus, the method for manufacturing the resin multilayer board 20 according to the second embodiment is particularly effective when the component 22 such as an IC component having a large number of minute terminals is mounted.

Next, a method for manufacturing a resin multilayer board according to a third embodiment of the present disclosure will be described. Here, the first half of the process of manufacturing the resin multilayer board, specifically, steps until a component 32 is joined to a thermoplastic resin sheet 33, will be described. In the subsequent step, the component may be incorporated into the resin multilayer body as shown in the first embodiment, or the component may be mounted on the surface of the resin multilayer body as shown in the second embodiment.

FIGS. 4A to 4E are side cross-sectional view showing the first half of the procedure of manufacturing the resin multilayer board according to the present embodiment. The present embodiment is different from the preceding embodiments in that the component and the thermoplastic resin sheet are joined to each other, not via a conductor portion and a via portion.

Figure 4A:
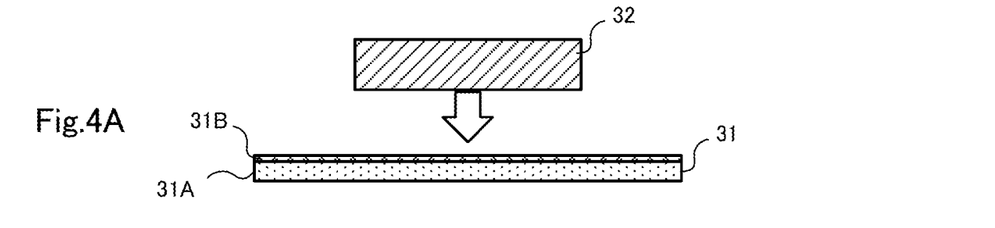
FIGS. 4A to 4E are side cross-sectional view at respective stages of a procedure of manufacturing a resin multilayer board according to a third embodiment of the present disclosure.

In the method for manufacturing the resin multilayer board according to the present embodiment, first, a step shown in FIG. 4A is executed. The step shown in FIG. 4A is a step corresponding to step S11 shown in FIG. 1.

Figure 4B:
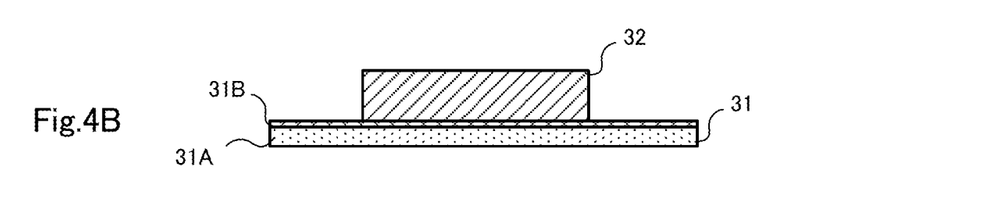

In step S11, first, a pressure-sensitive adhesive sheet 31 and the component 32 are prepared. The pressure-sensitive adhesive sheet 31 includes a resin layer 31A and a pressure-sensitive adhesive layer 31B. The pressure-sensitive adhesive layer 31B is provided on one principal surface of the resin layer 31A. The component 32 is a component which is not provided with a conductor portion on a surface thereof or the entirety of which is composed of a conductor. The surface of the component 32 is opposed to the pressure-sensitive adhesive layer 31B of the pressure-sensitive adhesive sheet 31, and the component 32 is bonded to the pressure-sensitive adhesive sheet 31 in a state where the component 32 is positioned with high accuracy. A structure shown in FIG. 4B is realized by this step.

Figure 4C:
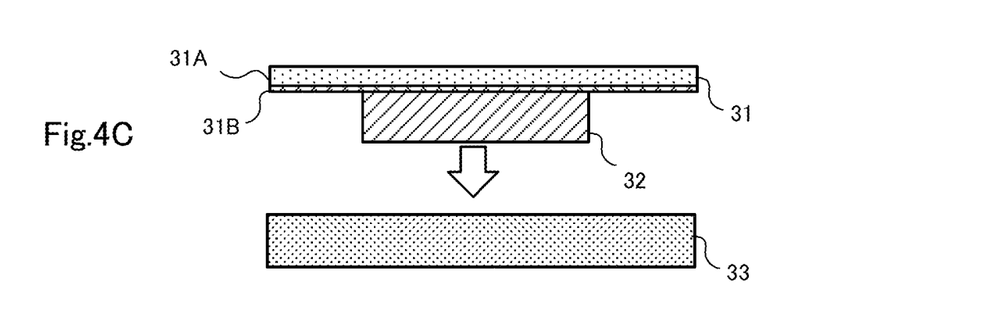

Next, in the method for manufacturing the resin multilayer board according to the present embodiment, a step shown in FIG. 4C is executed. The step shown in FIG. 4C is a step corresponding to step S12 shown in FIG. 1.

Figure 4D:
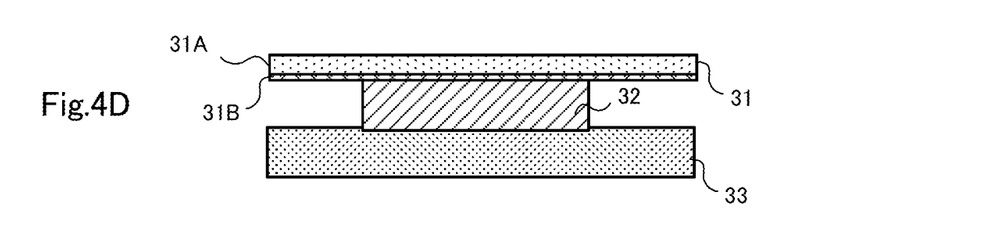

In step S12, first, the thermoplastic resin sheet 33 is prepared. The thermoplastic resin sheet 33 is not provided with a via portion or a conductor portion, and the entirety thereof is formed from a thermoplastic resin. Next, the surface of the pressure-sensitive adhesive sheet 31 at the pressure-sensitive adhesive layer 31B side is opposed to the surface of the thermoplastic resin sheet 33. At that time, holes (not shown) into which pins (not shown) for positioning to be inserted may be beforehand formed in the thermoplastic resin sheet 33 and the pressure-sensitive adhesive sheet 31. Thus, the thermoplastic resin sheet 33 and the pressure-sensitive adhesive sheet 31 can be positioned with high accuracy by inserting the pins into the holes. Then, the surface of the thermoplastic resin sheet 33 is pressed against the surface of the component 32 that is bonded to the pressure-sensitive adhesive sheet 31, and the surface of the component 32 and the surface of the thermoplastic resin sheet 33 are joined directly to each other by heating. A structure shown in FIG. 4D is realized by step S12.

By such step S12, the thermoplastic resin sheet 33 is joined to the component 32 by heating in a state where the component 32 is positioned relative to the pressure-sensitive adhesive sheet 31 with high accuracy, whereby it is possible to increase the accuracy of the position of the component 32 relative to the thermoplastic resin sheet 33.

Figure 4E:
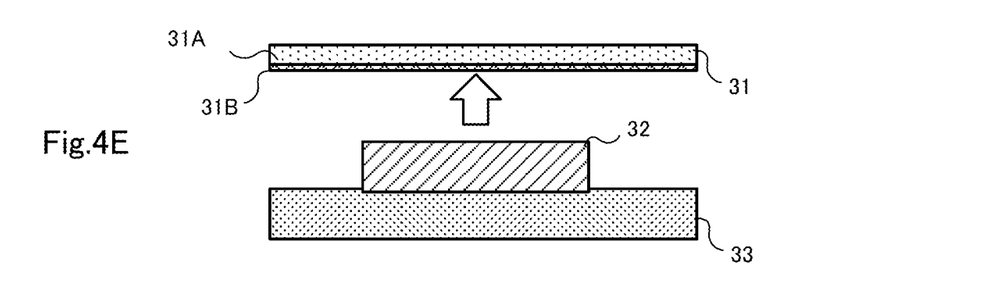

Next, in the method for manufacturing the resin multilayer board according to the present embodiment, a step shown in FIG. 4E is executed. The step shown in FIG. 4E is a step corresponding to step S13 shown in FIG. 1.

In step S13, after the temperature falls to a temperature at which the thermoplastic resin sheet 33 is sufficiently cured, the pressure-sensitive adhesive sheet 31 is peeled from the component 32 joined to the thermoplastic resin sheet 33. Thus, it is possible to transfer the component 32 from the pressure-sensitive adhesive sheet 31 to the thermoplastic resin sheet 33.

Then, another thermoplastic resin sheet is stacked and thermally welded to the thermoplastic resin sheet 33 to which the component 32 has been transferred. Accordingly, the resin multilayer board according to the present embodiment is manufactured. In the resin multilayer board according to the present embodiment, the component 32 which is positioned relative to the pressure-sensitive adhesive sheet 31 with high accuracy and bonded thereto is transferred from the pressure-sensitive adhesive sheet 31 to the thermoplastic resin sheet 33. Therefore, the component 32 is not substantially displaced due to shock or vibration before or during joining the component 32 to the thermoplastic resin sheet 33, and it is possible to incorporate or mount the component 32 with high position accuracy relative to the thermoplastic resin sheet 33.

What is claimed is:

1. A method for manufacturing a resin multilayer board, the method comprising the steps of:
    bonding a component to a pressure-sensitive adhesive layer of a pressure-sensitive adhesive sheet having the pressure-sensitive adhesive layer on a surface thereof;
    opposing a thermoplastic resin base material to a side of the pressure-sensitive adhesive sheet to which the pressure-sensitive adhesive layer is bonded, and joining the component bonded to the pressure-sensitive adhesive sheet and the thermoplastic resin base material to each other by heating;
    peeling the pressure-sensitive adhesive sheet from the component joined to the thermoplastic resin base material;
    stacking and thermally welding a plurality of thermoplastic resin base materials including the thermoplastic resin base material to which the component has been joined and from which the pressure-sensitive adhesive sheet has been peeled; and
    providing a mask layer over portions of the pressure-sensitive adhesive layer where no component is bonded.

2. The method for manufacturing the resin multilayer board according to claim 1, wherein
    the component includes a conductor portion on a surface joined to the thermoplastic resin base material, the thermoplastic resin base material includes a via portion in which a conductive paste which is metallized with heating is provided, at the surface joined to the conductor portion, and in the step of joining the component and the thermoplastic resin base material to each other by heating, the conductor portion of the component and the conductive paste of the via portion are joined to each other.

3. The method for manufacturing the resin multilayer board according to claim 2, wherein the conductor portion and the conductive paste form an intermetallic compound by heating to a predetermined temperature lower than a temperature at which the thermoplastic resin base material is plasticized.

4. The method for manufacturing the resin multilayer board according to claim 3, wherein
the conductive paste contains Sn, and
the conductor portion contains Cu.

5. A method for manufacturing a resin multilayer board, the method comprising the steps of:
bonding a component to a pressure-sensitive adhesive layer of a pressure-sensitive adhesive sheet having the pressure-sensitive adhesive layer on a surface thereof;
opposing a thermoplastic resin base material to a side of the pressure-sensitive adhesive sheet to which the pressure-sensitive adhesive layer is bonded, and joining the component bonded to the pressure-sensitive adhesive sheet and the thermoplastic resin base material to each other by heating;
peeling the pressure-sensitive adhesive sheet from the component joined to the thermoplastic resin base material;
stacking and thermally welding a plurality of thermoplastic resin base materials including the thermoplastic resin base material to which the component has been joined and from which the pressure-sensitive adhesive sheet has been peeled; and
providing a marking that indicates a component-disposed position over the pressure-sensitive adhesive sheet and disposing the component on the marking,
wherein the pressure-sensitive adhesive sheet is transparent.

6. The method for manufacturing the resin multilayer board according to claim 5, wherein
the component includes a conductor portion on a surface joined to the thermoplastic resin base material,
the thermoplastic resin base material includes a via portion in which a conductive paste which is metallized with heating is provided, at the surface joined to the conductor portion, and
in the step of joining the component and the thermoplastic resin base material to each other by heating, the conductor portion of the component and the conductive paste of the via portion are joined to each other.

7. The method for manufacturing the resin multilayer board according to claim 6, wherein the conductor portion and the conductive paste form an intermetallic compound by heating to a predetermined temperature lower than a temperature at which the thermoplastic resin base material is plasticized.

8. The method for manufacturing the resin multilayer board according to claim 7, wherein
the conductive paste contains Sn, and
the conductor portion contains Cu.

9. A method for manufacturing a resin multilayer board, the method comprising the steps of:

bonding a component to a pressure-sensitive adhesive layer of a pressure-sensitive adhesive sheet having the pressure-sensitive adhesive layer on a surface thereof;
opposing a thermoplastic resin base material to a side of the pressure-sensitive adhesive sheet to which the pressure-sensitive adhesive layer is bonded, and joining the component bonded to the pressure-sensitive adhesive sheet and the thermoplastic resin base material to each other by heating;
peeling the pressure-sensitive adhesive sheet from the component joined to the thermoplastic resin base material; and
stacking and thermally welding a plurality of thermoplastic resin base materials including the thermoplastic resin base material to which the component has been joined and from which the pressure-sensitive adhesive sheet has been peeled,
wherein the bonding the component to the pressure-sensitive adhesive layer comprises:
providing the component on a component tray; and
pressing the pressure-sensitive adhesive sheet over the component.

10. The method for manufacturing the resin multilayer board according to claim 9, wherein
the component includes a conductor portion on a surface joined to the thermoplastic resin base material,
the thermoplastic resin base material includes a via portion in which a conductive paste which is metallized with heating is provided, at the surface joined to the conductor portion, and
in the step of joining the component and the thermoplastic resin base material to each other by heating, the conductor portion of the component and the conductive paste of the via portion are joined to each other.

11. The method for manufacturing the resin multilayer board according to claim 10, wherein the conductor portion and the conductive paste form an intermetallic compound by heating to a predetermined temperature lower than a temperature at which the thermoplastic resin base material is plasticized.

12. The method for manufacturing the resin multilayer board according to claim 11, wherein
the conductive paste contains Sn, and
the conductor portion contains Cu.

13. A method for manufacturing a resin multilayer board, the method comprising the steps of:
bonding a component to a pressure-sensitive adhesive layer of a pressure-sensitive adhesive sheet having the pressure-sensitive adhesive layer on a surface thereof;
opposing a thermoplastic resin base material to a side of the pressure-sensitive adhesive sheet to which the pressure-sensitive adhesive layer is bonded, and joining the component bonded to the pressure-sensitive adhesive sheet and the thermoplastic resin base material to each other by heating;
peeling the pressure-sensitive adhesive sheet from the component joined to the thermoplastic resin base material; and
stacking and thermally welding a plurality of thermoplastic resin base materials including the thermoplastic resin base material to which the component has been joined and from which the pressure-sensitive adhesive sheet has been peeled,
wherein the component comprises a conductor portion, the thermoplastic resin base material comprises a conductive paste in a via portion, and the method further comprises:

forming an intermetallic compound between the conductor portion and the conductive paste by heating; and preventing, by the intermetallic compound, the component from being displaced relative to the thermoplastic resin base material when peeling the pressure-sensitive adhesive sheet from the component joined to the thermoplastic resin base material.

14. The method for manufacturing the resin multilayer board according to claim 13, wherein
the component includes a conductor portion on a surface joined to the thermoplastic resin base material,
the thermoplastic resin base material includes a via portion in which a conductive paste which is metallized with heating is provided, at the surface joined to the conductor portion, and
in the step of joining the component and the thermoplastic resin base material to each other by heating, the conductor portion of the component and the conductive paste of the via portion are joined to each other.

15. The method for manufacturing the resin multilayer board according to claim 14, wherein the conductor portion and the conductive paste form an intermetallic compound by heating to a predetermined temperature lower than a temperature at which the thermoplastic resin base material is plasticized.

16. The method for manufacturing the resin multilayer board according to claim 15, wherein
the conductive paste contains Sn, and
the conductor portion contains Cu.

* * * * *